(12) United States Patent
Kitamura

(10) Patent No.: US 6,570,237 B2
(45) Date of Patent: May 27, 2003

(54) SEMICONDUCTOR DEVICE WITH A PROTECTIVE DIODE HAVING A HIGH BREAKDOWN VOLTAGE

(75) Inventor: Akio Kitamura, Nagano (JP)

(73) Assignee: Fuji Electric Co., Ltd. (JP)

( * ) Notice: Subject to any disclaimer, the term of this patent is extended or adjusted under 35 U.S.C. 154(b) by 0 days.

(21) Appl. No.: 10/128,541

(22) Filed: Apr. 23, 2002

(65) Prior Publication Data

US 2002/0190341 A1 Dec. 19, 2002

(30) Foreign Application Priority Data

Apr. 23, 2001 (JP) ........................................ 2001-124642

(51) Int. Cl.[7] .............................................. H01L 29/00
(52) U.S. Cl. ........................ 257/499; 257/500; 257/501; 257/502; 257/509; 257/577
(58) Field of Search ................................ 257/499–502, 257/509, 29.229, 29.242, 29.255, 29.261, 27.024, 27.029, 27.05, 27.06, 577

(56) References Cited

U.S. PATENT DOCUMENTS 4,024,564 A * 5/1977 Shimada et al. ............... 29/34
4,285,116 A * 8/1981 Meguro ....................... 29/571
4,394,674 A * 7/1983 Sakuma et al. .............. 257/336
6,359,326 B1 * 3/2002 Utsunomiya et al. ........ 257/538
6,429,501 B1 * 8/2002 Tsuchitani et al. ........... 257/493

FOREIGN PATENT DOCUMENTS

| JP | 61-207052 | * | 9/1986 | ................. 257/398 |
| JP | 3-22476 | * | 1/1991 | ................. 257/336 |

* cited by examiner

Primary Examiner—Jasmine J B Clark
(74) Attorney, Agent, or Firm—Rossi & Associates

(57) ABSTRACT

A semiconductor device forms a protective diode with a high breakdown voltage at a power terminal of a power IC. An N-type well is formed in a P-type semiconductor substrate, the well electrically connected to a power supply terminal. An N-type channel stopper region is formed in the well. A P-type substrate pickup region is formed outside the well. The distance between the substrate pickup region and the channel stopper region is adjusted such that the breakdown voltage of the parasitic diode is not lower than the rated voltage and not higher than the breakdown voltage of the high voltage PMOSFET fabricated in the well. The protective diode absorbs electrostatic breakdown and electrical noises without an additional circuit protection device or manufacturing process.

7 Claims, 8 Drawing Sheets

Equipotential lines showing electric field concentration near surface region

Distance between n⁺ channel stopper region and p⁺ substrate pickup region

SEMICONDUCTOR DEVICE WITH A PROTECTIVE DIODE HAVING A HIGH BREAKDOWN VOLTAGE

FIELD OF THE INVENTION

The present invention relates to a semiconductor device including a high voltagepower IC. More specifically, the invention provides a device formed with a protective diode having a high breakdown voltage.

BACKGROUND OF THE INVENTION

Because power supply terminals of an IC are generally necessary to have low impedance, they can not be provided with a protective resistance that deals with electrostatic breakdown or electric noises. Consequently, it is known to provide a protective diode that transfers charges to a substrate for avoiding electrostatic breakdown or handling noises. A power IC also takes this general construction.

However, in the case of the power IC, there was a problem that a protective diode with a high breakdown voltage must be specially prepared since the power terminal of the power IC experiences a high voltage.

The present invention is made to solve the above problem by providing a semiconductor device having a construction that forms a protective diode with a high breakdown voltage at a power terminal of a power IC at which a high voltage is applied, to deal with electrostatic breakdown and electrical noises without an additional manufacturing process.

SUMMARY OF THE INVENTION

To solve the above problem, the semiconductor device of the present invention comprises a well of a second conductivity type electrically connecting to a power supply terminal formed in a semiconductor substrate of a first conductivity type. The semiconductor device of the invention also comprises a channel stopper region of the second conductivity type formed in the well and a substrate pickup region of the first conductivity type formed outside the well. The distance between the substrate pickup region and the channel stopper region is adjusted such that the breakdown voltage of a parasitic diode constructed by the well and the substrate is not lower than a rated voltage of the semiconductor device and not higher than breakdown voltage of a high voltage semiconductor device fabricated within the well.

According to the present invention, the channel stopper region formed in the well is distant from the substrate pickup region formed outside the well at such a distance that the breakdown voltage of the parasitic diode constructed by the well and the substrate is not lower than the rated voltage and not higher than the breakdown voltage of the high voltage semiconductor device fabricated within the well. Consequently, the breakdown voltage of the parasitic diode constructed by the well and the substrate is not lower than the rated voltage of the semiconductor device and not higher than the breakdown voltage of the high voltage semiconductor device.

BRIEF DESCRIPTION OF THE DRAWINGS

The invention will now be described with reference to certain preferred embodiments thereof and the accompanying drawings, wherein.

DETAILED DESCRIPTION OF THE PREFERRED EMBODIMENTS

Preferred embodiments of the present invention will be described in detail in the following with reference to accompanying drawings. Although the following description will be made in the case the first conductivity type is a P-type and the second conductivity type is an N-type, the present invention is also applied to the case the first conductivity type is an N-type and the second conductivity type is a P-type.

First Embodiment of the Invention

Figure 1:
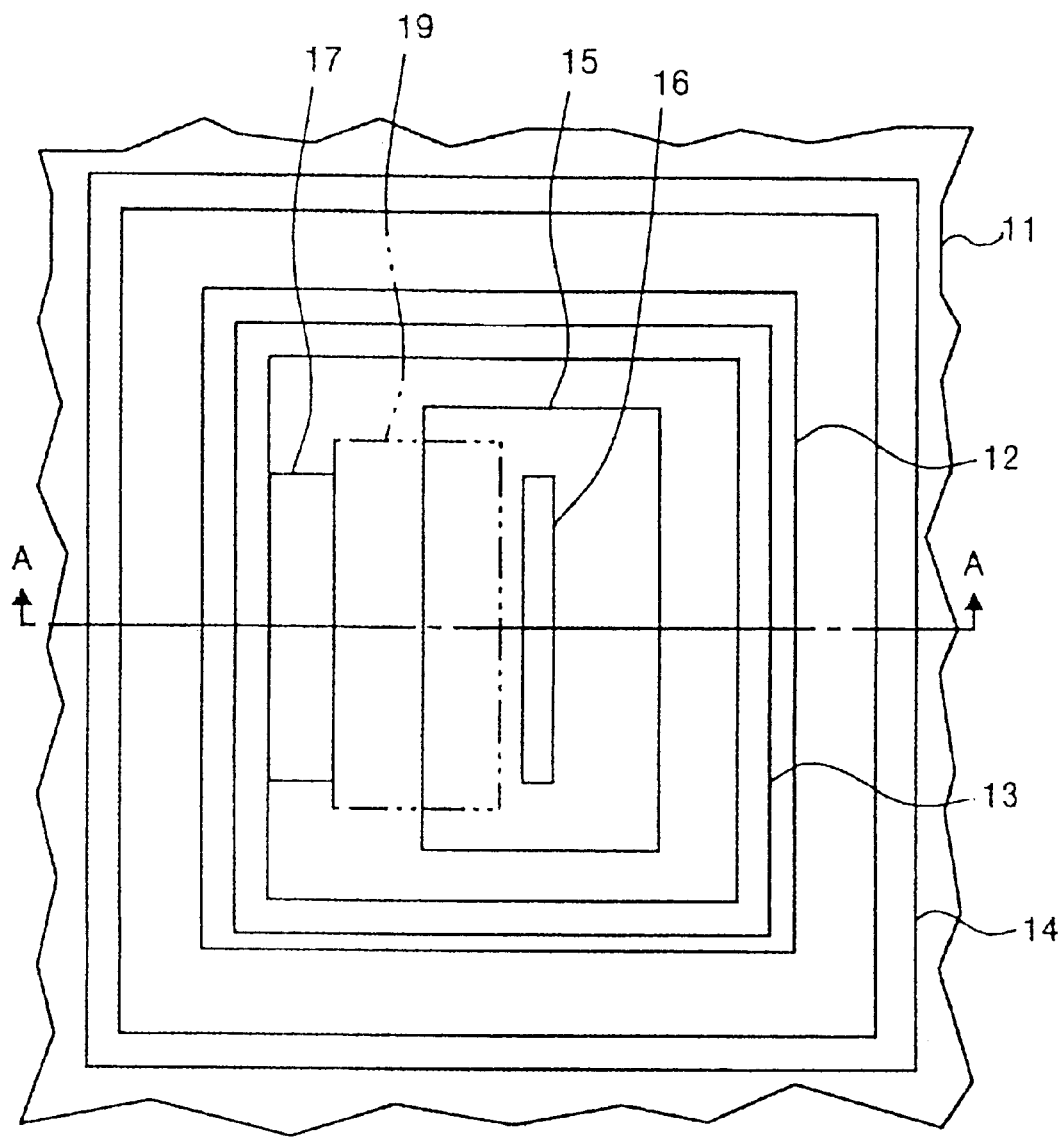
FIG. 1 is a plan view showing a semiconductor device of the first embodiment of the present invention.
Figure 2:
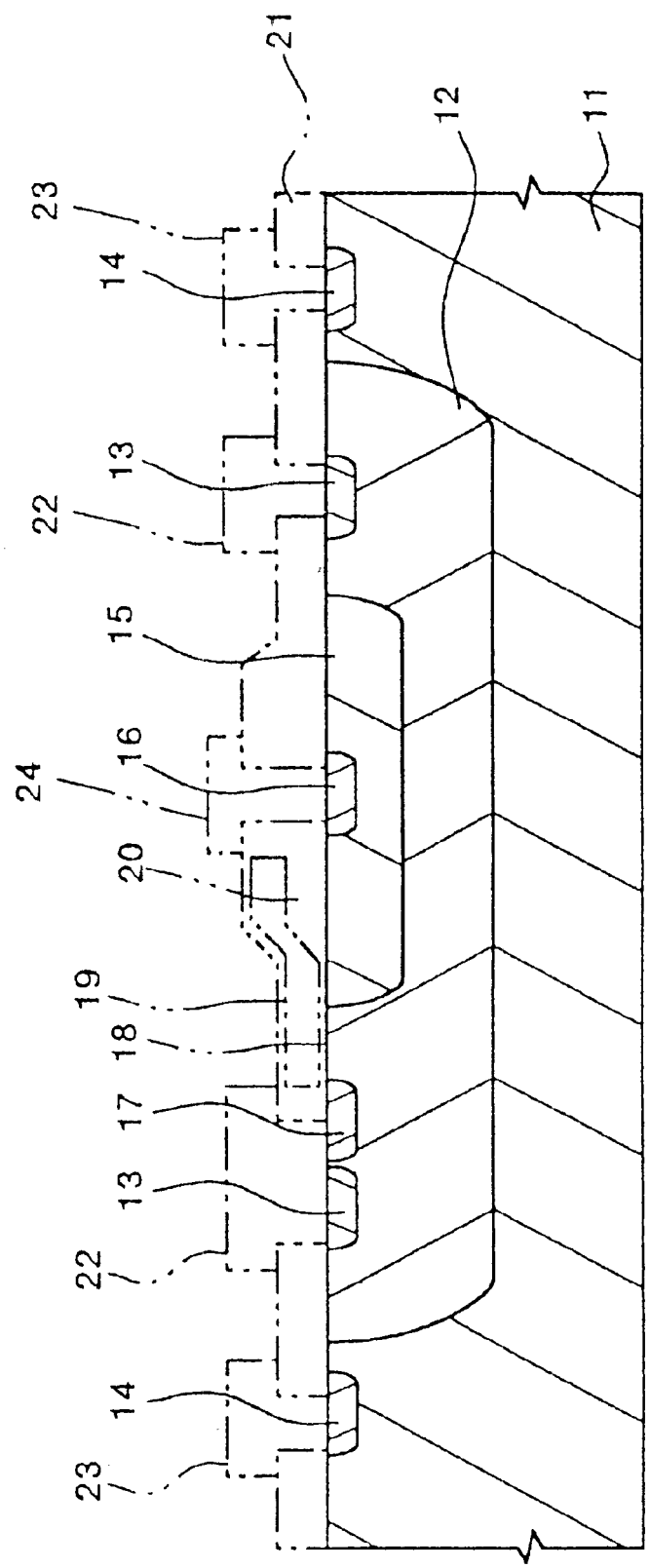
FIG. 2 is a cross-sectional view along line A—A in FIG. 1.
Figure 3:
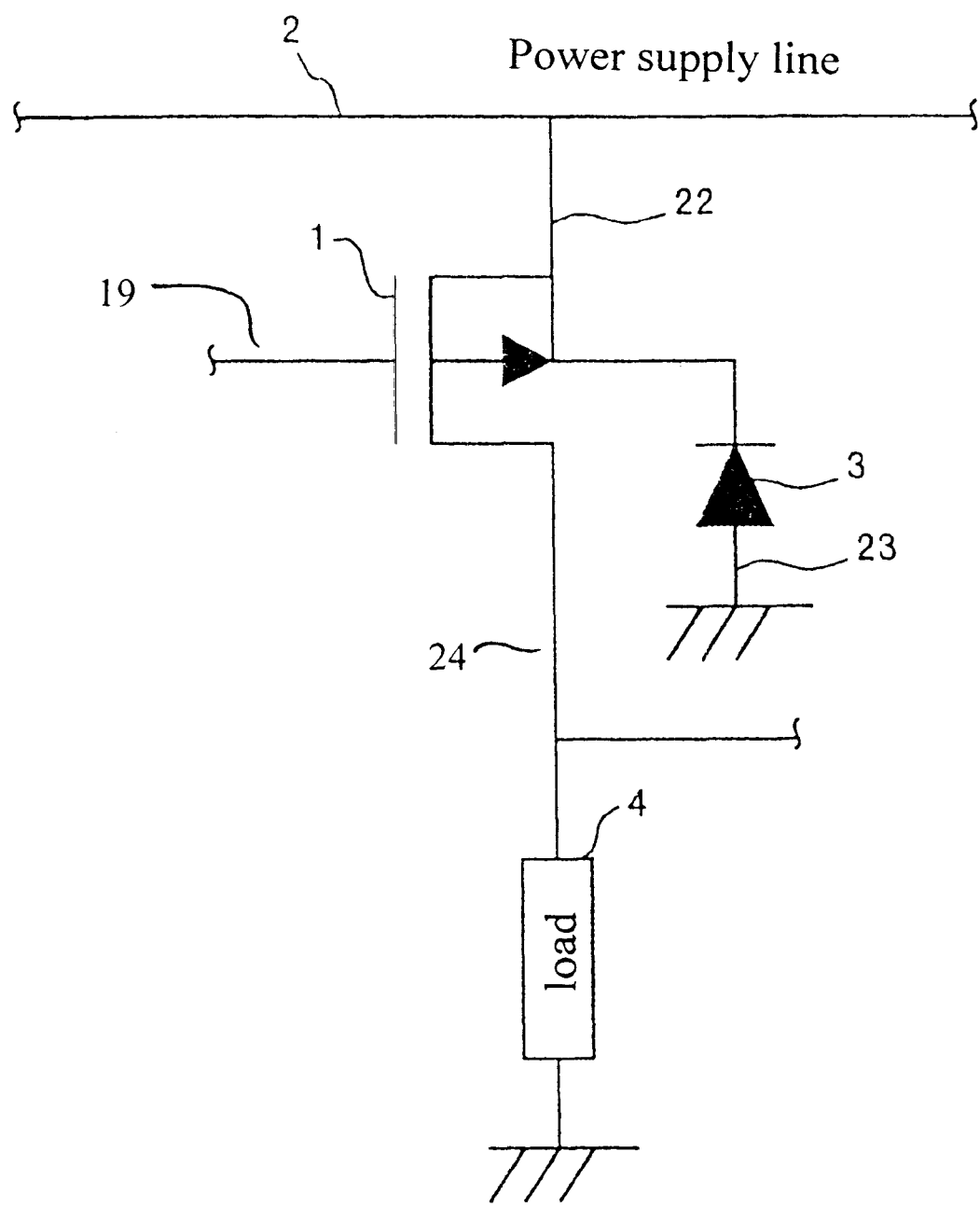
FIG. 3 is a schematic circuit diagram showing a semiconductor device of the first embodiment of the present invention.

FIG. 1 is a plan view showing an essential part of a semiconductor device of the first embodiment of an embodiment of the present invention. FIG. 2 is a cross-sectional view along line A—A in FIG. 1. In FIG. 1 and FIG. 2, a gate electrode is shown by a double-dotted line, and an insulator, a contact part, and other electrodes are omitted in FIG., 1, and shown by double-dotted lines in FIG. 2. FIG. 3 is a schematic circuit diagram showing a constitution of a semiconductor device of the first embodiment of embodiment of the present invention.

A well 12 of an N-type semiconductor is formed in a principal surface region of a substrate 11 of P-type semiconductor. In the peripheral portion within the well 12, formed is an N-type channel stopper region 13 having higher impurity concentration than the well 12. On the surface portion of the substrate 11 outside the well 12, a P-type substrate pickup region 14 having higher impurity concentration than the substrate 11 is formed opposite to the channel stopper region 13.

A P-type offset drain region 15 is formed inside the channel stopper region 13. A P-type drain region 16 is formed in the offset drain region 15. A P-type source region 17 is formed a little apart from the offset drain region 15 inside the channel stopper region 13. A gate insulating film 18 is formed on the box of the surface between the offset drain region 15 and the source region 17. A gate electrode 19 is formed on the gate insulating film 18. A local oxidation of silicon (LOCOS) film 20, which is a thick oxide film, is formed on the surface of the offset drain region 15 for reducing concentration of electric field.

The channel stopper region 13 is electrically connected to a first metal electrode 22 through a contact part that penetrates interlayer dielectric 21, and the substrate pickup region 14 is connected to a second metal electrode 23. The first metal electrode 22 is, at the same time, a source electrode, and it is electrically connected to the source region 17. The drain region 16 is connected to a drain electrode 24 through a contact part that penetrates the LOCOS film 20 and the interlayer dielectric 21.

As illustrated in FIG. 3, the first metal electrode 22, or source electrode, represents a source terminal of the high voltage PMOSFET 1 having a structure as described above connects through a power supply line 2 to a power supply terminal, which is not shown in the figure. Consequently, the well 12 connects through the power supply line 2 to the power supply terminal which is not shown in the figure. Since the second metal electrode 23 is grounded, a parasitic diode 3 is formed between the well 12 and the substrate 11, in which the substrate 11 is an anode and the well 12 is a cathode. The drain electrode 24, which represents a drain terminal, connects appropriately to a load 4 and an internal circuit, which is not shown in the figure. The gate electrode 19, which represents a gate terminal, appropriately connects to a power supply control circuit and other circuits that are not shown in the figure.

The distance between the substrate pickup region 14 and the channel stopper region 13 is adjusted so that the breakdown voltage of the parasitic diode 3 is not lower than the rated voltage and not higher than the breakdown voltage of the high voltage PMOSFET 1. For example, when the breakdown voltage of the PMOSFET 1 is 70 V, the distance between the substrate pickup region 14 and the well 12 may be adjusted to be 6 $\mu$m, as a mask size, and the offset of the channel stopper region 13 from the boundary of the well 12, that is a well edge, is preferably decreased to 2 $\mu$m, as a mask size. These dimensions result a breakdown voltage between the well 12 and the substrate 11 of 60 V, which is lower than the breakdown voltage of the PMOSFET 1 of 70 V. Therefore, when a positive bias voltage of electrostatic or electrical noise is applied to the power supply terminal, breakdown occurs between the well 12 and the substrate 11 and charges are absorbed. Needless to say, the breakdown voltage of the parasitic diode 3 is not lower than the rated voltage.

When a rating of the power supply voltage is 30 V, for example, the distance between the substrate pickup region 14 and the well 12 may be 2 $\mu$m as a mask size and the offset of the channel stopper region 13 from the boundary of the well 12 may be zero $\mu$m as a mask size. These dimensions adjust the breakdown voltage between the well 12 and the substrate 11 to be 35 V. This value corresponds to the minimum value that secures the power supply voltage of 30 V taking dispersion into consideration.

Figure 4:
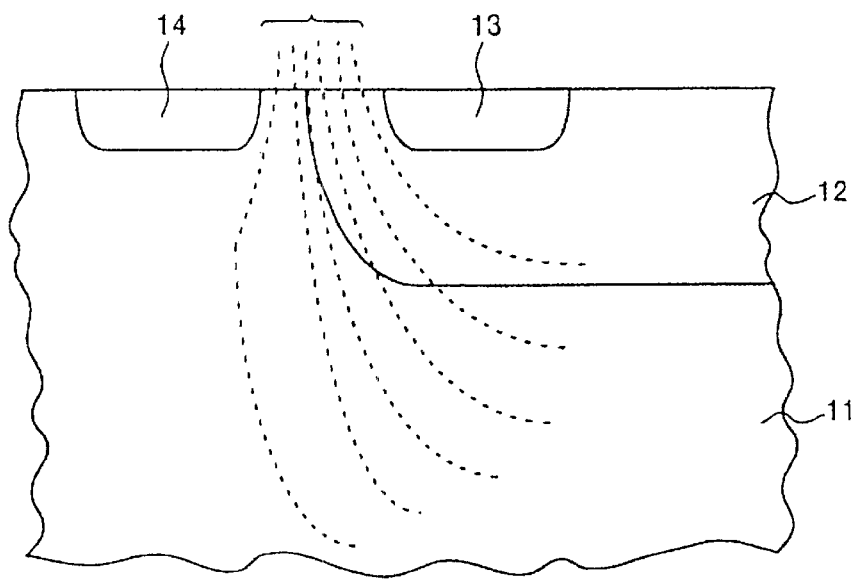
FIG. 4 is a drawing showing equipotential lines in the region between the channel stopper region and the substrate pickup region in the first embodiment.
Figure 5:
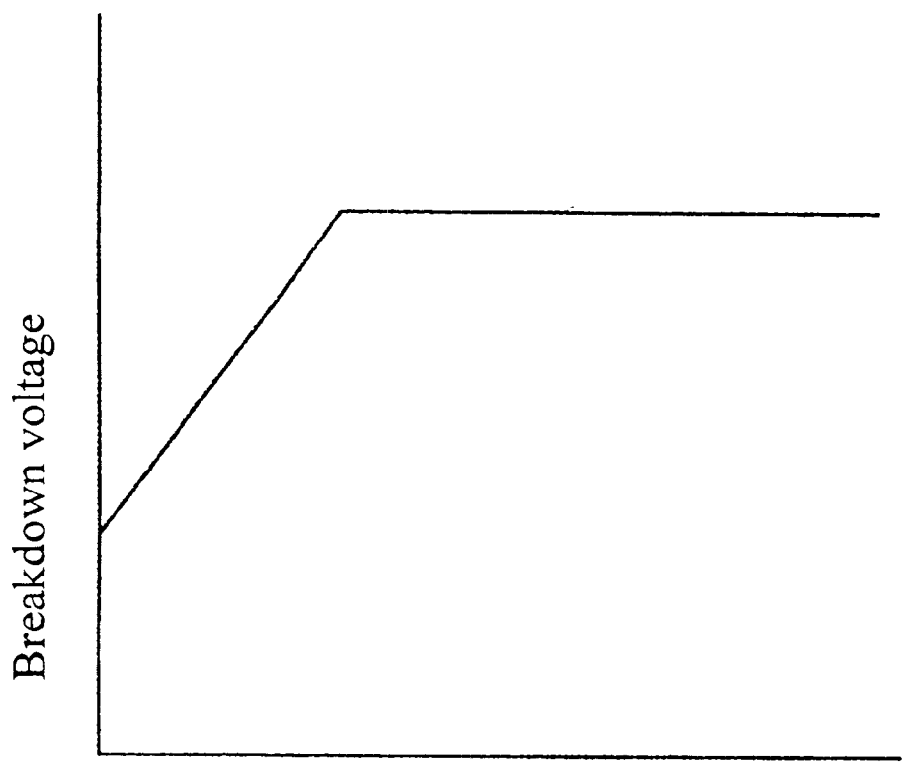
FIG. 5 is a graph showing a relation between breakdown voltage and the distance between the channel stopper region and the substrate pickup region in the semiconductor device shown in FIG. 4.

Thus, the peripheral breakdown voltage of the PMOSFET 1 can be controlled with the distances between the substrate pickup region 14, the well 12, and between the channel stopper region 13 and the boundary of the well by providing the substrate surface with a breakdown point. Therefore, the peripheral breakdown voltage of the PMOSFET 1 can be optimized corresponding to the power supply rated voltage. FIG. 4 is a drawing showing equipotential lines in the region between the channel stopper region 13 and the substrate pickup region 14. FIG. 5 is a graph showing a relation between breakdown voltage and the distance between the n+ channel stopper region 13 and the p− substrate pickup region 14 in the semiconductor layer shown in FIG. 4.

According to the first embodiment of the invention described above, the channel stopper region 13 is apart from the substrate pickup region 14 at such a distance that the breakdown voltage of the parasitic diode 3 constructed by the well 12 and the substrate 11 is not lower than the rated voltage and not higher than breakdown voltage of the PMOSFET 1. Consequently, the breakdown voltage of the parasitic diode 3 is not lower than the rated voltage and not higher than the breakdown voltage of the PMOSFET 1. When electrostatic voltage or electrical noise is applied to the power supply terminal, breakdown occurs between the well 12 and the substrate 11, and charges are absorbed. Therefore, damage is avoided in the PMOSFET, a device connected to the PMOSFET, or other device connected to the power supply terminal.

The first embodiment described above utilizes the breakdown of the parasitic diode 3 for circuit protection. Therefore, any additional manufacturing process or any additional diode is not needed.

In a conventional semiconductor device, the breakdown voltage of the periphery of a high voltage PMOSFET, which is the breakdown voltage of the parasitic diode constructed by a well and a substrate, is higher than the breakdown voltage of the PMOSFET. In contrast, in accordance with the present invention the breakdown voltage of the parasitic diode 3 is lower than the breakdown voltage of the high voltage PMOSFET 1 in the first embodiment of the invention, which is brought by reducing the distance between the channel stopper region 13 and the substrate pickup region 14 as compared with the conventional device. As a result, the size of the high voltage PMOSFET is decreased and thus, the size of the chip for mounting the PMOSFET is also reduced.

Figure 6:
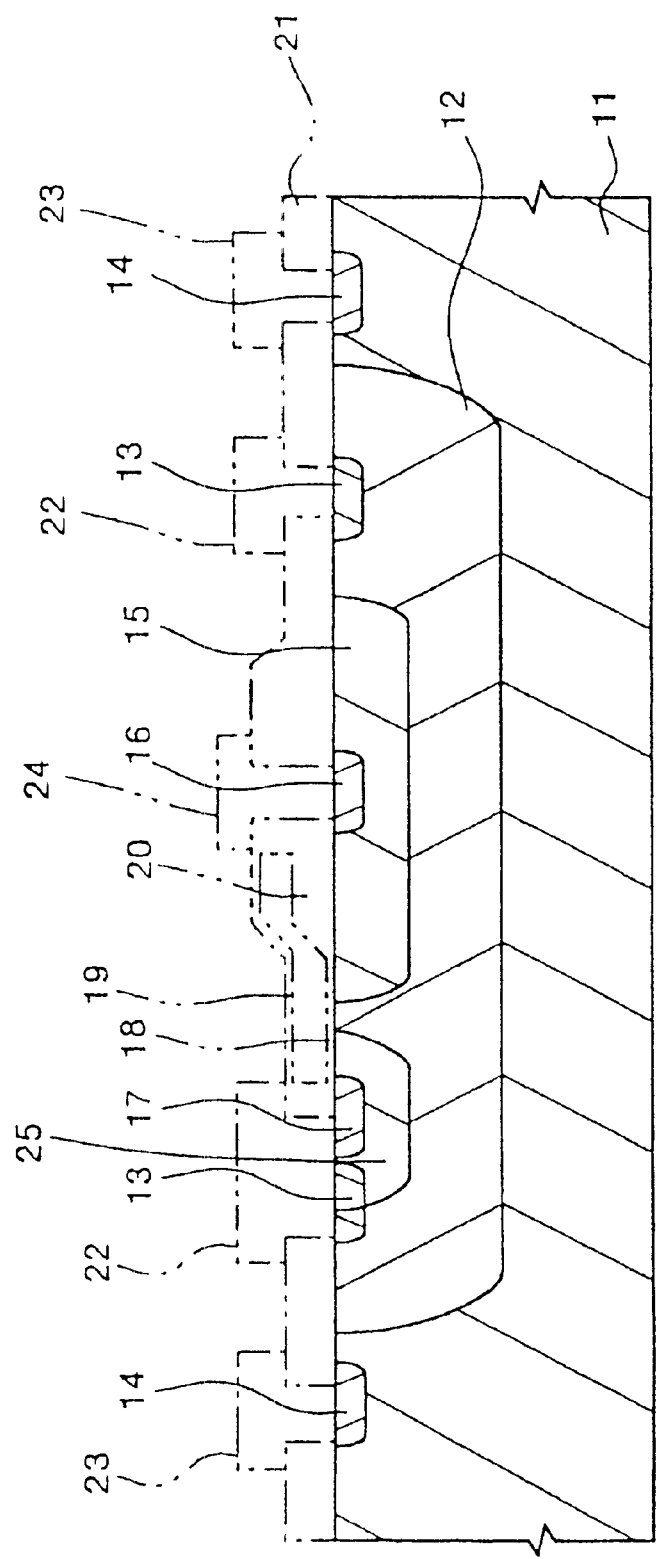
FIG. 6 is a cross-sectional view showing a variation within the first embodiment.

As shown in FIG. 6, a high voltage semiconductor device fabricated in the well 12 may be a high voltage PDMOS that further comprises an N-type base region 25 surrounding the source region 17 in addition to the structure of the PMOSFET 1 in FIG. 2.

Second Embodiment of the Invention

Figure 7:
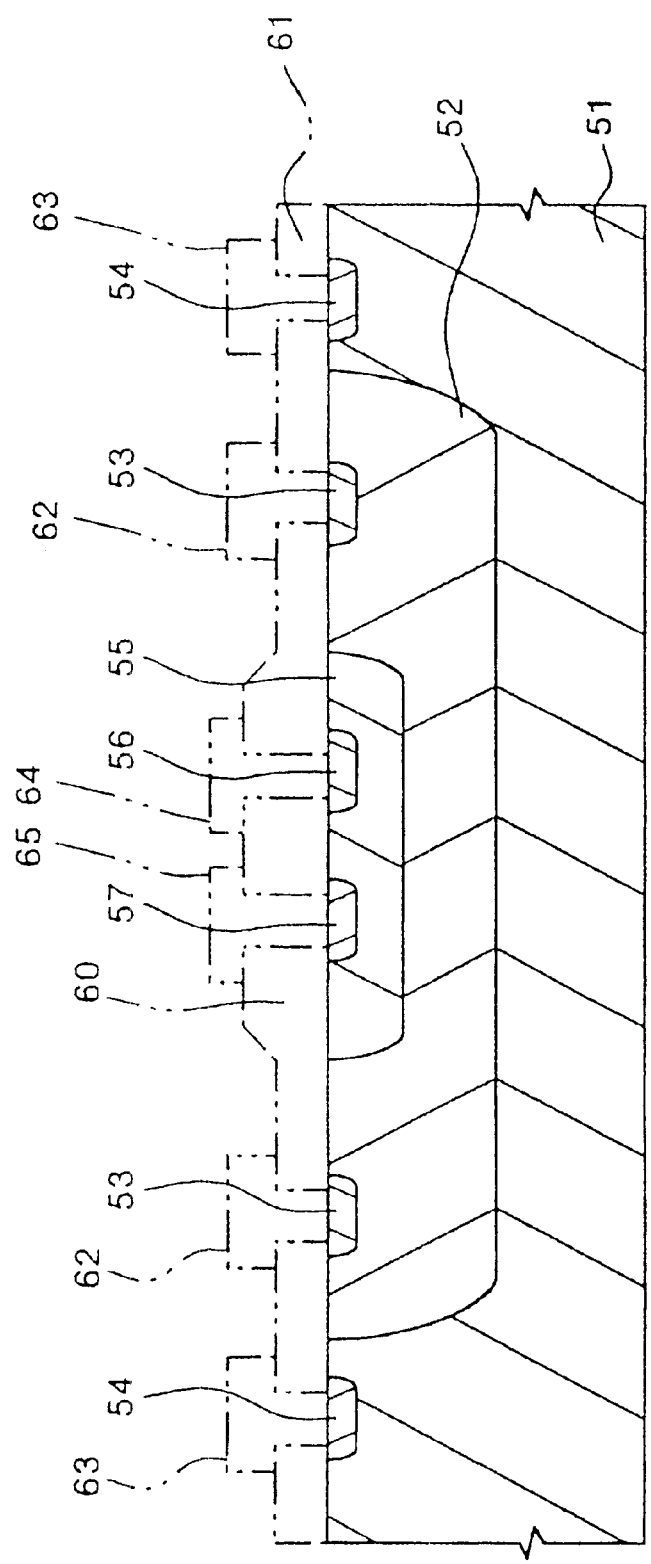
FIG. 7 is a cross-sectional view showing a semiconductor device of the second embodiment of the present invention.
Figure 8:
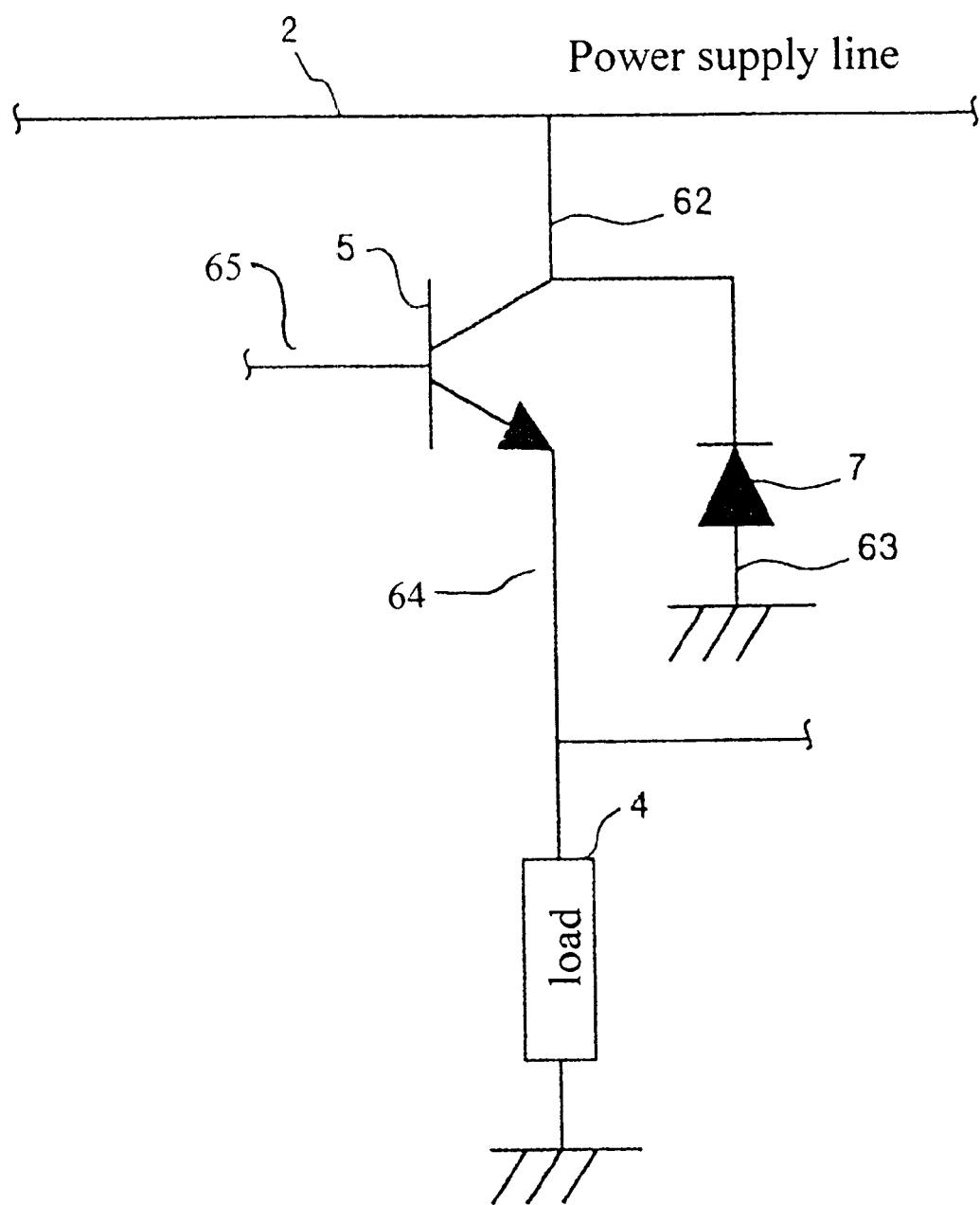
FIG. 8 is a schematic circuit diagram showing a semiconductor device of the second embodiment of the present invention.

FIG. 7 is a cross-sectional view showing an essential part of a semiconductor device of the second embodiment of the present invention, in which an insulating film, a contact part, and electrodes are shown by chain double-dotted lines. FIG. 8 is a schematic circuit diagram showing a constitution of a semiconductor device of the second embodiment of the invention.

An N-type well 52 that is a collector region is formed in a principal surface region of a substrate 51 of P-type semiconductor. In the peripheral portion within the well 52, formed is an N-type channel stopper region 53, which also functions as a collector pickup region, having higher impurity concentration than the well 52. On the surface portion of the substrate 51 outside the well 52, a P-type substrate pickup region 54 having higher impurity concentration than the substrate 51 is formed opposite, with reference to the edge of the well 52, to the channel stopper region 53.

A P-type base region 55 is formed inside the box of the channel stopper region 53. An N-type emitter region 56 is formed in the base region 55. A P-type base pickup region 57 is formed apart from the emitter region 56 in the base region 55. A LOCOS film 60, which is a thick oxide film, is formed on the surface of the base region 55 for reducing concentration of electric field.

The channel stopper region 53 and the substrate pickup region 54 are electrically connected to a first metal electrode 62 and a second metal electrode 63 respectively, through contact parts that penetrate an interlayer dielectric 61. The first metal electrode 62 is, at the same time, the collector electrode. The emitter region 56 and the base pickup region 57 electrically connect to an emitter electrode 64 and a base electrode 65 respectively, through contact parts that penetrate the LOCOS film 60 and the interlayer dielectric 61.

As illustrated in FIG. 8, the first metal electrode 62, or collector electrode, represents the collector terminal of a high voltage NPN transistor 5 having a structure as described above connects through a power supply line 2 to a power supply terminal, which is not shown in the figure. Consequently, the well 52 connects through the power supply line 2 to the power supply terminal, which is not shown in the figure. Since the second metal electrode 63 is grounded, a parasitic diode 7 is formed between the well 52 and the substrate 51, in which the substrate 51 is an anode and the well 52 is a cathode. The emitter electrode 64, which represents an emitter terminal, connects to a load 4 and an internal circuit, which is not shown in the figure. The base electrode 65, which represents a base terminal, connects to a power supply control circuit and other circuits that are not shown in the figure.

The distance between the substrate pickup region 54 and the channel stopper region 53 is adjusted so that the breakdown voltage of the parasitic diode 7 is not lower than the rated voltage and not higher than the breakdown voltage of the NPN transistor 5. For example, when the breakdown voltage between the emitter and the collector of the NPN transistor 5 is 30 V, the distance between the substrate pickup region 54 and the well 52 may be adjusted to be 2 $\mu$m, as a mask size, and the offset of the channel stopper region 53 from the boundary of the well, that is a well edge, may be zero $\mu$m, as a mask size. These dimensions results in the breakdown voltage between the well 52 and the substrate 51 of 25 V, which is lower than the breakdown voltage 30 V of the NPN transistor 5. Therefore, when a positive bias voltage of electrostatic or electrical noise is applied to the power supply terminal, breakdown occurs between the well 52 and the substrate 51, and charges are absorbed. Needless to say, the breakdown voltage of the parasitic diode 7 is not lower than the rated voltage.

According to the second embodiment of the invention described above, the channel stopper region 53 is apart from the substrate pickup region 54 at such a distance that the breakdown voltage of the parasitic diode 7 constructed by the well 52 and the substrate 51 is not lower than the rated voltage and not higher than the breakdown voltage of the NPN transistor. Consequently, the breakdown voltage of the parasitic diode 7 is not lower than the rated voltage and not higher than the breakdown voltage of the NPN transistor. When high voltage of electrostatic or electrical noise is applied to the power supply terminal, breakdown occurs between the well 52 and the substrate 51, and charges are absorbed. Therefore, damage is avoided in the NPN transistor, a device connected to the NPN transistor, or other device connected to the power supply terminal.

The second embodiment described above utilizes the breakdown of the parasitic diode 7 for circuit protection. Therefore, any additional manufacturing process or any additional diode is not needed.

In a conventional semiconductor device, the breakdown voltage of the periphery of a high voltage NPN transistor, which is the breakdown voltage of the parasitic diode constructed by a well and a substrate, is higher than the breakdown voltage of the NPN transistor. In contrast, in accordance with the present invention, the breakdown voltage of the parasitic diode 7 is lower than the breakdown voltage of the high voltage NPN transistor 5 in the second embodiment of the invention, which is brought by reducing the distance between the channel stopper region 53 and the substrate pickup region 54 as compared with the conventional one. As a result, the size of the high voltage NPN transistor is decreased and thus, the size of the chip for mounting the NPN transistor is also reduced.

Specific design may be varied from the examples in the embodiments described above. The numerical values of the breakdown voltage and the dimensions in the embodiments are only examples, and the present invention shall not be restricted by the values.

According to the present invention, the channel stopper region formed in the well is apart from the substrate pickup region formed outside the well at such a distance that the breakdown voltage of the parasitic diode constructed by the well and the substrate is not lower than the rated voltage and not higher than the breakdown voltage of the high voltage semiconductor device fabricated within the well. Consequently, the breakdown voltage of the parasitic diode constructed by the well and the substrate is not lower than the rated voltage and not higher than the breakdown voltage of the high voltage semiconductor device. When high voltage of electrostatic or electrical noise is generated in such a construction of a semiconductor device, the parasitic diode in the periphery of the high voltage semiconductor device breaksdown and absorbs charges to protect the high voltage semiconductor device. Therefore, a semiconductor device is provided that exhibits improved electrostatic discharge immunity and noise immunity of a power supply terminal that experiences high voltage, without additional manufacturing process and without an additional high breakdown voltage diode.

What is claimed is:

1. A semiconductor device comprising:
    a semiconductor substrate of first conductivity type;
    a well of second conductivity type formed in said substrate;
    a high voltage semiconductor device fabricated in said well;
    a channel stopper region of said second conductivity type formed in said well outside said high voltage semiconductor device and having higher impurity concentration than said well; and
    a substrate pickup region of said first conductivity type formed outside said well and having higher impurity concentration than said substrate;
    wherein said substrate pickup region is apart from said channel stopper region at such a distance that breakdown voltage between said well and said substrate is not lower than rated voltage of said semiconductor device and not higher than a breakdown voltage of said high voltage semiconductor device.

2. A semiconductor device according to claim 1 further comprising:
    a first metal electrode electrically connected to said channel stopper region; and
    a second metal electrode formed opposite to said first metal electrode and electrically connected to said substrate through said substrate pickup region.

3. A semiconductor device according to claim 1, wherein said well electrically connects to a power supply terminal that supplies a power supply voltage.

4. A semiconductor device according to claim 1, wherein said high voltage semiconductor device comprises
    a source region of said first conductivity type,
    an offset drain region of said first conductivity type apart from said source region,
    a LOCOS film formed on a surface of said offset drain region,
    a drain region of said first conductivity type formed in said offset drain region,
    a gate insulating film formed on a surface between said source region and said offset drain region, a gate electrode formed on said gate insulating film, a source electrode electrically connected to said source region and said channel stopper region, and a drain electrode electrically connected to said drain region.

5. A semiconductor device according to claim 4 further comprising:

a base region of said second conductivity type in said well apart from said offset drain region and surrounding said source region.

6. A semiconductor device according to claim 2, wherein said high voltage semiconductor device comprises said well serving as a collector region, said channel stopper region serving as a collector pickup region, said first metal electrode serving as a collector electrode, a base region of said first conductivity type formed inside said channel stopper region, a LOCOS film formed on a surface of said base region, a base pickup region of said first conductivity type formed in said base region and having higher impurity concentration than said base region, an emitter region of said second conductivity type formed in said base region, a base electrode electrically connected to said base region through said base pickup region, and an emitter electrode electrically connected to said emitter region.

7. A semiconductor device according to claim 3, wherein said high voltage semiconductor device comprises said well serving as a collector region, said channel stopper region serving as a collector pickup region, said first metal electrode serving as a collector electrode, a base region of said first conductivity type formed inside said channel stopper region, a LOCOS film formed on a surface of said base region, a base pickup region of said first conductivity type formed in said base region and having higher impurity concentration than said base region, an emitter region of said second conductivity type formed in said base region, a base electrode electrically connected to said base region through said base pickup region, and an emitter electrode electrically connected to said emitter region.

* * * * *